(12) United States Patent
Xie et al.

(10) Patent No.: US 6,967,976 B2
(45) Date of Patent: *Nov. 22, 2005

(54) LASER WITH REFLECTIVE ETALON TUNING ELEMENT

(75) Inventors: Jinchun Xie, Cupertino, CA (US); Alexandre Katchanov, Sunnyvale, CA (US); Barbara Paldus, Portola Valley, CA (US)

(73) Assignee: Picarro, Inc., Sunnyvale, CA (US)

( * ) Notice: Subject to any disclaimer, the term of this patent is extended or adjusted under 35 U.S.C. 154(b) by 38 days.

This patent is subject to a terminal disclaimer.

(21) Appl. No.: 10/909,989

(22) Filed: Aug. 3, 2004

(65) Prior Publication Data

US 2005/0008045 A1 Jan. 13, 2005

Related U.S. Application Data

(63) Continuation-in-part of application No. 10/231,647, filed on Aug. 29, 2002, now abandoned.

(51) Int. Cl.$^7$ .............................. H01S 3/10; H01S 3/08
(52) U.S. Cl. .............................. 372/20; 372/98; 372/99
(58) Field of Search .............................. 372/20, 98–99, 372/101

(56) References Cited

U.S. PATENT DOCUMENTS

| | | | | |
|---|---|---|---|---|
| 4,504,950 A | * | 3/1985 | AuYeung | 372/20 |
| 4,962,503 A | * | 10/1990 | Liu et al. | 372/32 |
| 5,058,124 A | * | 10/1991 | Cameron et al. | 372/107 |
| 5,132,976 A | * | 7/1992 | Chung et al. | 372/6 |
| 6,240,110 B1 | * | 5/2001 | Ershov | 372/20 |
| 6,359,914 B1 | * | 3/2002 | Powers et al. | 372/25 |
| 6,463,086 B1 | * | 10/2002 | Stamm et al. | 372/20 |
| 6,526,071 B1 | * | 2/2003 | Zorabedian et al. | 372/20 |
| 2003/0007526 A1 | * | 1/2003 | Pontis et al. | 372/38.02 |
| 2003/0012230 A1 | * | 1/2003 | Hopkins et al. | 372/20 |
| 2003/0016707 A1 | * | 1/2003 | McDonald et al. | 372/20 |
| 2003/0048817 A1 | * | 3/2003 | Steffens et al. | 372/20 |
| 2003/0048992 A1 | * | 3/2003 | Lundqvist | 385/50 |

* cited by examiner

*Primary Examiner*—Minsun Oh Harvey
*Assistant Examiner*—James Menefee
(74) *Attorney, Agent, or Firm*—Herbert Burkard

(57) ABSTRACT

A tunable laser and laser tuning method based on the use of a tunable etalon in reflection as a mirror within a laser cavity and forming an end reflective surface thereof. The laser emission wavelength is not necessarily at a wavelength of peak etalon reflectivity. A preferred embodiment makes use of a microelectromechanical etalon to tune an external cavity semiconductor.

11 Claims, 8 Drawing Sheets

LASER WITH REFLECTIVE ETALON TUNING ELEMENT

CROSS-REFERENCE TO RELATED APPLICATIONS

This application is a continuation-in-part of application Ser. No. 10/231,647, filed Aug. 29, 2002, now abandoned, the disclosure of which is incorporated herein by this reference.

FIELD OF INVENTION

This invention relates to tunable lasers and to a method of tuning lasers using an etalon in reflection.

BACK GROUND OF THE INVENTION

A laser consists of a pumped gain medium placed within an optical resonator.

The pumped gain medium provides optical amplification, and the optical resonator provides optical feedback, such that light circulates within the optical resonator and is repeatedly amplified by the gain medium. Frequently the optical resonator is referred to as the laser cavity. Various pumps are known, the most common being optical pumps and electrical pumps.

If the round trip loss within the optical resonator is less than the round trip gain provided by the gain element, the optical power increases on each round trip around the cavity. Since the amplification provided by the gain element decreases as the circulating optical power increases, the steady state circulating power is the power required to make the round trip gain equal to the roundtrip loss. One of the elements within the optical resonator acts as the output coupler, whereby a certain fraction of the circulating power is emitted from the optical resonator, and constitutes the laser output. A partially transmitting mirror is a typical output coupler. Of course, the wavelength of the light emitted by the laser need not be in the visible part of the electromagnetic spectrum.

An external cavity semiconductor laser is one type of laser. As light makes a round trip within an external cavity semiconductor laser, light is emitted from an optically or electrically pumped semiconductor gain medium, passes through various optical elements, and impinges on the gain medium as a reflected return beam. Typically, multiple semiconductor layers are epitaxially grown on a semiconductor substrate to form the gain medium, and the gain medium waveguide is formed by lithographic processing of some or all of the epitaxially grown layers. The resulting waveguide is contiguous with the substrate. That is, the waveguide is either in direct contact with the substrate or there are one or more intervening solid layers between the waveguide and the substrate. The epitaxially grown layers can have various compositions, which may or may not be the same as the composition of the substrate.

An optical beam emitted from a single-mode optical waveguide has an amplitude and phase profile ("mode profile") which is determined by the waveguide. The amplitude and phase profile of the return beam is generally not exactly the same as that of the mode profile, and in such cases, not all of the return beam power is launched (i.e. coupled) into the gain medium waveguide. For example, if a return beam having a power Pb impinges on the waveguide endface, only some lesser amount of power Po is actually launched into the waveguide. The coupling efficiency η=Po/Pb depends on how close the return beam amplitude and phase profile is to the mode profile. The waveguide gain medium therefore acts as an intracavity spatial filter.

The laser emission wavelength is the wavelength at which the net gain (i.e. gain loss) is maximal. If the gain medium provides amplification over a wide wavelength range and the spectral dependence of the loss is dominant (i.e. the difference between minimum loss and maximum loss at different wavelengths is large compared to the gain), then the laser emission wavelength will closely approximate the wavelength at which the round trip loss in the resonator is minimized. For example, if the wavelength of minimum loss is $\lambda_o$, and the laser emission wavelength is $\lambda_1$ the wavelengths $\lambda_o$ and $\lambda_1$) will differ if the wavelength dependence of the gain is strong enough that the round trip net gain is maximized at a wavelength which differs only slightly from the wavelength of minimum loss. Thus, the most common way to make a tunable laser is to insert one or more optical elements within the laser cavity to create a tunable intracavity bandpass filter. Since a tunable bandpass filter will have a lower loss for a narrow range of optical wavelengths centered about a center wavelength $\lambda_c$, and higher loss for wavelengths outside this range, such a filter will tune the laser emission wavelength. In this case, the difference between $\lambda_o$ and $\lambda_1$ will be no larger than the filter bandwidth. The use of an etalon in transmission to provide an intracavity bandpass filter for laser tuning is known [e.g. Zorabedian et al. Optics Letters 13(10) p 826 (1988); U.S. Pat. No. 5,949,801 to Tayebati; U.S. Pat. No. 6,301,274 to Tayebati et al].

An etalon comprises two substantially parallel, partially transmitting mirrors. It is known that etalon mirrors need not be exactly parallel to form an optical resonator. Transmission through an etalon is generally low, except for a series of peaks, which are approximately equally spaced at an interval known as the free spectral range of the etalon, as seen in FIG. 2a. The center wavelength of an etalon transmission peak can be varied by changing the optical distance between the etalon mirrors.

The optical distance $d_{opt}$ between two points a and b is given by:

$$d_{opt} = \int_a^b n(x) dx$$

where n(x) is the position-dependent index of refraction.

It is necessary for the etalon free spectral range to be substantially larger than the desired tuning range, to ensure that only one of the etalon transmission peaks is within the desired tuning range. The bandwidth of the transmission peaks is also an important parameter for laser tuning, since bandwidth determines the loss seen by the modes adjacent to the lasing mode, which in turn determines the side mode suppression ratio (SMSR). Both the bandwidth and free spectral range of an etalon can be varied according to known design principles.

Reflection from an etalon is generally high, except for a series of valleys of low reflectivity, which are approximately equally spaced at the free spectral range, as seen in FIG. 2b. As seen in FIGS. 2a and 2b, the etalon reflectivity is high where the transmissivity is low, and vice versa. Because the reflection spectrum of an etalon does not provide a narrow bandpass filter, an etalon would not be expected to act as a tuning element in reflection. See, for example, Siegman, Lasers. University Science Books, Mill Valley Calif. (1986), p 424, and U.S. Pat. No. 6,351,484 both of which describe the use of a reflective etalon as an output coupler for a high power laser. In this case, the etalon is not acting as a tuning element but rather as a mirror.

In U.S. Pat. No. 5,901,163 a low finesse etalon is used as an end element of the laser cavity, and its function is to work as an output coupler, but at the same time, to further narrow the laser line formed by the main tuning element (a diffraction grating). However, this application is different from the present invention in several critical aspects:

i) The etalon in the patent is used at the peak of its reflectivity. The distortion of spatial distribution of the phase or the amplitude of the reflected beam, has no impact on its operation. In the present invention, the lasing occurs not at the peak of the etalon's reflectivity, but rather close to the minimum of its reflectivity. The reason for this is the distortion of spatial distribution of the phase or the amplitude of the reflected beam.

ii) The etalon of the patent may provide some additional narrowing of the laser emission spectrum (in addition to that due to the grating), but this is only possible for very low finesse of the etalon, such that the reflection spectral dependence is a sinusoidal function with a low peak value. For the operation of such an additional narrowing element it is essential to have only two single reflections from both surfaces. In the case of multiple beam interference (high finesse), the reflection spectrum will look like a plateau with narrow gaps. No additional narrowing will be provided in such a high-finesse case. In the present invention, in contrast, the finesse will be high, and again, the lasing occurs close to narrow gaps in the reflectivity spectral dependence of the etalon.

iii) The etalon design of the patent cannot, on its own, function as a tuning element. In such case the laser output spectrum will consist of several lines corresponding to the reflection peaks of the etalon. It needs the diffraction grating as the main tuning element, and one of its peaks has to be matched with the spectral position of the grating peak. In the present invention, the etalon can function as the only tuning element operating in reflection, as the end reflector of the cavity.

SUMMARY OF THE INVENTION

The present invention is based on the surprising discovery that an etalon in reflection can act as an effective laser tuning element. We have found this to be true even in cases where the laser emission wavelength is not a wavelength of peak etalon reflectivity. In a preferred embodiment of the present invention, an etalon with a mirror separation that is electrostatically adjustable by applying a voltage to the etalon is used as the tuning element. The etalon mirror separation determines the laser emission wavelength.

DETAILED DESCRIPTION OF THE DRAWINGS

Figure 1:
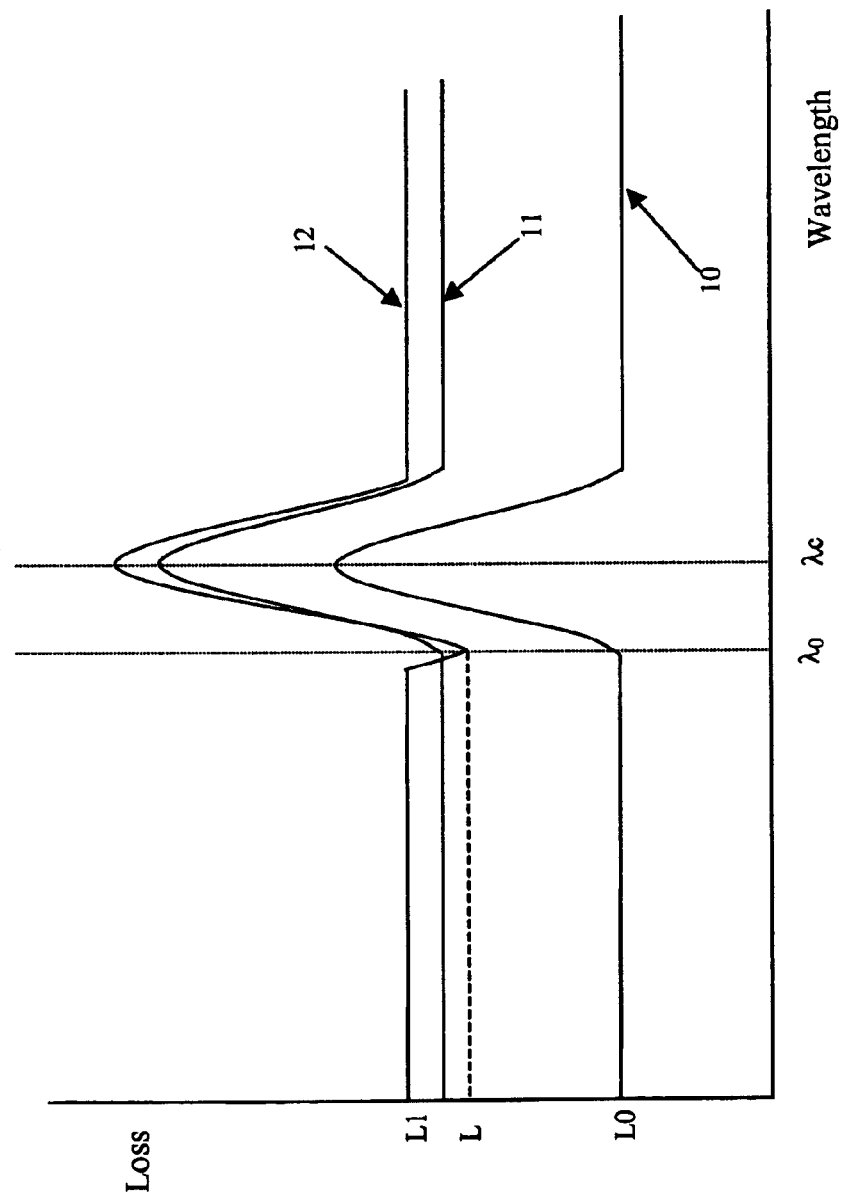
FIG. 1 shows the round trip loss vs. wavelength for different laser alignments.

The physical basis of the tuning mechanism of the present invention can be understood by reference to FIG. 1. Consider a laser with an intracavity spatial filter e.g., a waveguide and a reflective etalon, aligned for maximum output power when the beam distortion provided by the etalon is zero. In this case the wavelength dependence of the round trip loss will be as indicated by curve 10 in FIG. 1. However, such a loss versus wavelength dependence will not tune the laser, since no intracavity bandpass filter is present. In addition, the laser will not lase close to the resonance peak of the etalon but rather emit a broad spectrum at the wings of the peak where the loss is lower.

Now consider the same laser, except that the cavity is "misaligned" from the condition of maximum output power, by slightly tilting the etalon. This will still not provide an intracavity band pass filter but the loss in such case will be higher as indicated by curve 11 in FIG. 1. However, there are various ways an etalon can provide beam distortion. For example, multiple reflections within an etalon generally impart distortion to the reflected beam. Similarly, if the incident beam illuminates an edge of the etalon, or a localized defect within the etalon, the reflected beam will be distorted.

The introduction of beam distortion in a laser may further increase the round trip cavity loss. However, a reflective etalon only significantly distorts the beam over a limited range of wavelengths centered at its resonance wavelength $\lambda_c$. Beam distortion provided by a reflective etalon compensates for the "misalignment" at a particular wavelength $\lambda_0$. In this situation, the wavelength dependence of the round trip loss will be as indicated by curve 12 in FIG. 1. Due to the changed alignment of the laser, the background loss LI is necessarily larger than the loss LO. The round trip loss L at $\lambda_0$ is less than LI due to the compensation of the cavity "misalignment" by beam distortion, and this creates the intracavity bandpass filter shown in FIG. 1. This intracavity bandpass filter is tunable by changing the etalon center wavelength $\lambda_c$. Note that it is not necessary to vary the cavity alignment in order to tune the laser.

The purpose of the intra-cavity spatial filter in the present invention is to enhance (i.e. increase the difference between L and LI) this bandpass filtering effect by making the cavity round trip loss a more sensitive function of both beam distortion and cavity alignment. Although it is theoretically possible to obtain adequate laser tuning via this mechanism in the absence of a spatial filter, in practice an intra-cavity spatial filter is necessary in order to obtain a broad tuning range that is desirable for many laser applications. In an external cavity semiconductor laser, the single mode waveguide in the gain medium acts as an intracavity spatial filter.

Ordinarily, a laser cavity is aligned such that loss is minimized. For example, the standard procedure for alignment of an external cavity semiconductor laser entails centering the beam on all optical elements and aligning the return mirror for maximum retro reflection. We have found that this conventional alignment method is not appropriate when a reflective etalon is employed as a tuning element. Instead, a "misalignment" of the laser cavity, e.g. a small angular departure from the condition of maximum retro reflection at the etalon return mirror, and/or a decentering of the optical beam on the reflective etalon such that the beam is not entirely within the clear aperture of the etalon, is required to obtain good tuning performance. In practice, the required mis-alignment can be determined by starting with the conventional alignment and then systematically changing the alignment while monitoring the single mode tuning range in order to maximize the tuning range. Systematic optimization procedures of this type are known in the art.

Figure 3:
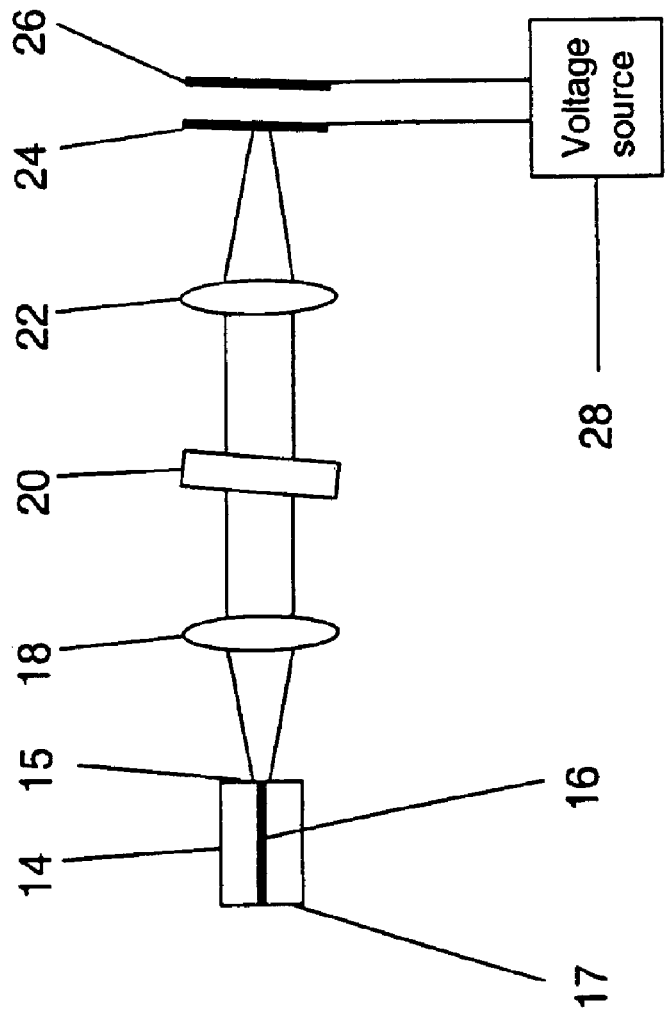
FIG. 3 is a schematic block diagram of an embodiment of the invention where a grid fixing etalon is used to provide discrete tunability.

FIG. 3 is a schematic view of a tunable laser constructed according to one embodiment of the invention. The electrically pumped semiconductor gain medium 14 includes a single mode optical waveguide 16 with an intracavity endface 15 and a second endface 17. The endface 15 is anti-reflection coated and/or tilted with respect to the axis of waveguide 16 to reduce its reflectivity. Light is emitted from endface 15 and propagates into a collimation lens 18. In one experiment, the horizontal and vertical beam divergences were approximately 12 and 32 degrees respectively (full angle, half-maximum of intensity). However, these beam divergences are not believed to be critical parameters for practicing the invention. The collimation lens 18 receives the diverging light beam from endface 15 and transmits it to a grid fixing etalon 20. Preferably, lens 18 is selected and positioned such that the beam transmitted to grid fixing etalon 20 is collimated. Methods for selecting and positioning lens 18 to perform this collimating function are well known in the art. In one experiment, a Geltech 350390 lens (NA=0.65, f=2.75 mm) was found to be suitable.

Figure 2:
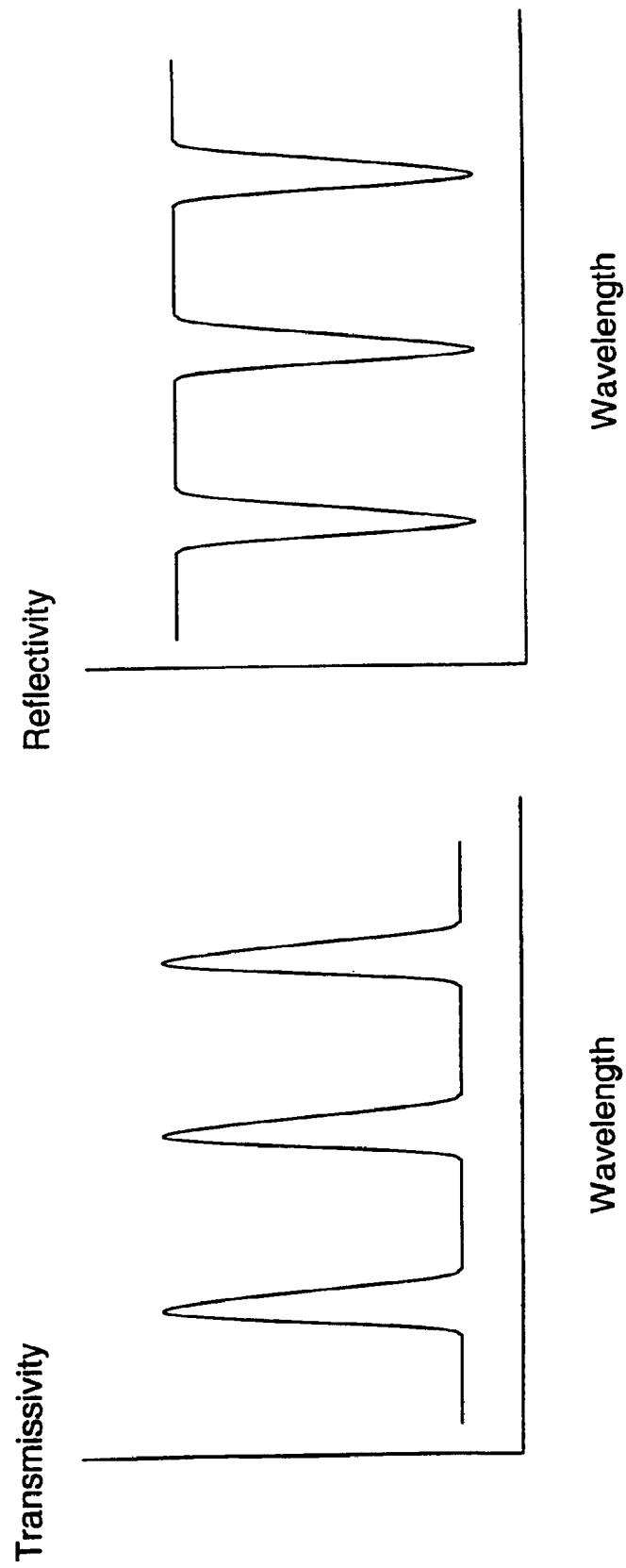
FIG. 2a shows the transmissivity vs. wavelength for an etalon.
FIG. 2b shows the reflectivity vs. wavelength for an etalon.

The collimated beam is received by the grid fixing etalon 20. The grid fixing etalon 20 is useful in some embodiments of the invention to realize certain advantages, but it is not a required element for implementing the reflective etalon tuning mechanism. For some applications, a tunable laser is required to accurately tune to specific predefined channels which are equally spaced in frequency. For such applications, it is desirable for the laser emission wavelength to be matched to a standardized frequency grid so that tuning the laser causes the emission wavelength to move in discrete steps from one channel to the next (referred to as "discrete tunability"), as opposed to continuous tuning or stepwise tuning that is not aligned to a standardized frequency grid. Since the transmission peaks of an etalon, as shown in FIG. 2a, are equally spaced in frequency, the insertion of an etalon with the appropriate free spectral range (e.g. 100 GHz or 50 GHz) can provide discrete tunability.

In order to perform its intended function, the grid fixing etalon 20 in FIG. 3 is preferably inserted into the laser such that the etalon surface normals make a small angle (preferably 1–10 degrees) with respect to the cavity axis, to thereby ensure that the beams reflected from the etalon surfaces do not efficiently couple into the laser cavity. The etalon finesse is preferably moderate (e.g. 2<finesse<10), and this value of finesse is chosen to provide low loss in transmission through etalon 20, and the desired level of spectral selectivity. Since etalon 20 serves as an absolute wavelength reference for the laser, it is preferably fabricated using materials, such as fused silica, that are mechanically stable and temperature insensitive.

Discrete tunability can also be achieved by appropriately engineering a second (parasitic) etalon that is already present within the cavity (e.g. an etalon formed by the two faces of a semiconductor gain chip) to perform the grid fixing function. It is also possible to pre-select the overall optical path length of the laser cavity to provide discrete tunability, since the longitudinal mode spacing of a laser is determined by the round trip optical path length. If a grid fixing etalon is used to provide discrete tunability, then it is advantageous to choose the overall cavity length such that the grid formed by the cavity modes can be at least approximately aligned to the grid determined by the grid fixing etalon. Similarly, it is also advantageous to ensure that parasitic etalons, such as the etalon formed by the endfaces of the gain chip, create a grid that is alignable with the desired grid, to allow a less demanding specification to be placed on the endface reflectivities.

After passing through grid fixing etalon 20, the beam is received by a lens 22, which transmits the beam to a tuning etalon formed by mirrors 24 and 26. Preferably, lens 22 is selected and positioned so that the transmitted beam is focused down to a beam waist located at or near the tuning etalon. Methods for selecting and positioning lens 22 to perform this function are well known in the art. In one experiment, a Geltech 350280 lens (NA=0.15, f=18.4 mm) was found to be suitable.

Two mirrors 24 and 26 together form the reflective etalon tuning element.

Mirror 24 is partially transmitting, such that light incident on mirror 24 can couple into the cavity formed by mirrors 24 and 26. The mirror 24 is positioned such that it is at or near the beam focus point created by the lens 22. Since the etalon formed by mirrors 24 and 26 is used in reflection, mirror 26 can be partially transmitting. The optical distance between mirrors 24 and 26 is electrically controllable with a voltage source 28. Preferably, the free spectral range of the reflective etalon formed by mirrors 24 and 26 is larger than the desired tuning range, which can, for example, vary from roughly 10 nm to 80 nm depending on the application. The etalon bandwidth is preferably in the range 0.2 nm to 5 nm.

A preferred approach for providing the reflective etalon is the use of microelectromechanical systems (MEMS) technology to fabricate mirrors 24 and 26 on a common substrate where application of a voltage between mirrors 24 and 26 changes their separation electrostatically. Such tunable MEMS etalons are known in the MEMS art, as are methods for obtaining the preferred free spectral ranges and bandwidths identified above. In one experiment, the MEMS etalon had a 40 micron diameter, a bandwidth of 1–2 nm, and was tunable from 1554 nm to 1571.5 nm.

An alternative approach for tuning the reflective etalon is the use of an electro-optic material (e.g. lithium niobate, lithium tantalate or a liquid crystal) between the etalon mirrors, so that the optical path length between the mirrors can be electrically adjusted without physically moving the mirrors. Another alternative approach for tuning the reflective etalon is to alter the etalon temperature to thereby change the optical path length between the mirrors. The spacing between the mirrors, and the refractive index of the material between the mirrors are both temperature dependent, and temperature tunable etalons are known in the art.

The beam which is reflected from the etalon formed by mirrors 24 and 26 passes back through elements 22, 20 and 18 in succession, to impinge on waveguide endface 15. A certain fraction of this light is coupled into waveguide 16, propagates to endface 17 where it is reflected, and propagates back to endface 15 to complete a cavity round trip.

Figure 4:
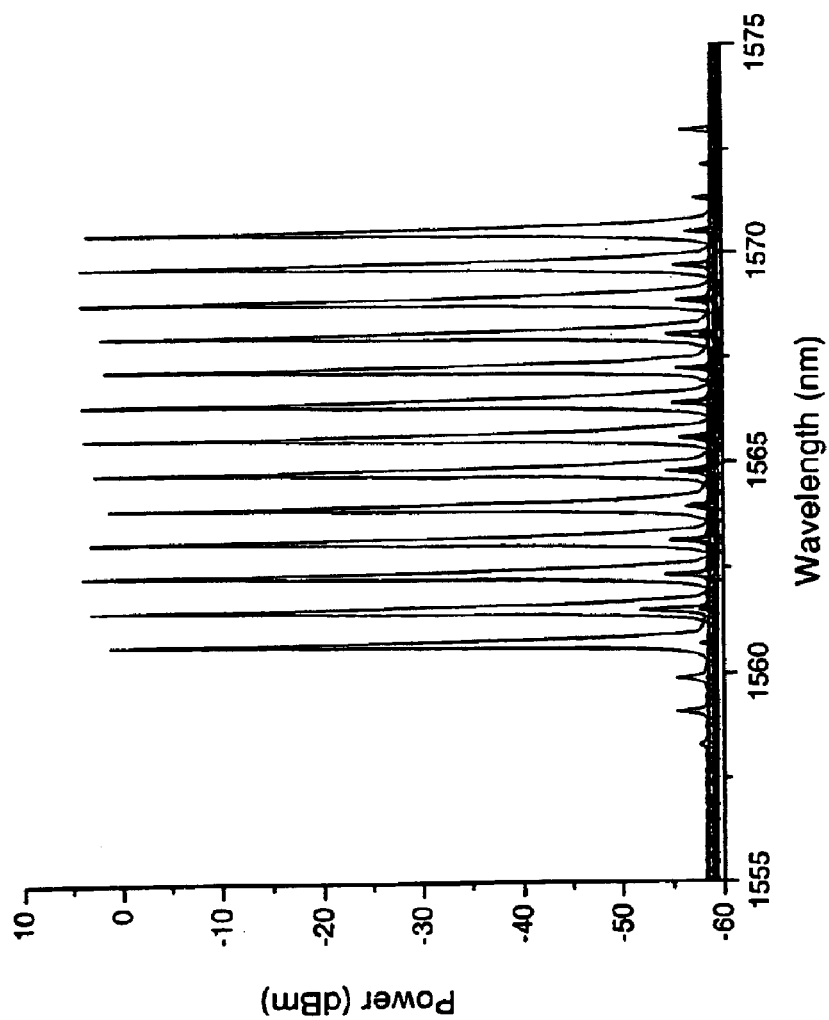
FIG. 4 shows the tuning behavior of a laser using an etalon in reflection according to the present invention.

FIG. 4 shows output optical spectra for a laser which is tuned by an etalon in reflection, and which has a 100 GHz grid fixing etalon in the cavity as shown in FIG. 3. Several curves are shown, one for each wavelength to which the laser is tuned. A 10 nm tuning range and >50 dB side mode suppression ratio are obtained. The effect of the 100 GHz grid fixing etalon is seen in the regular spacing of the side mode peaks.

Figure 5:
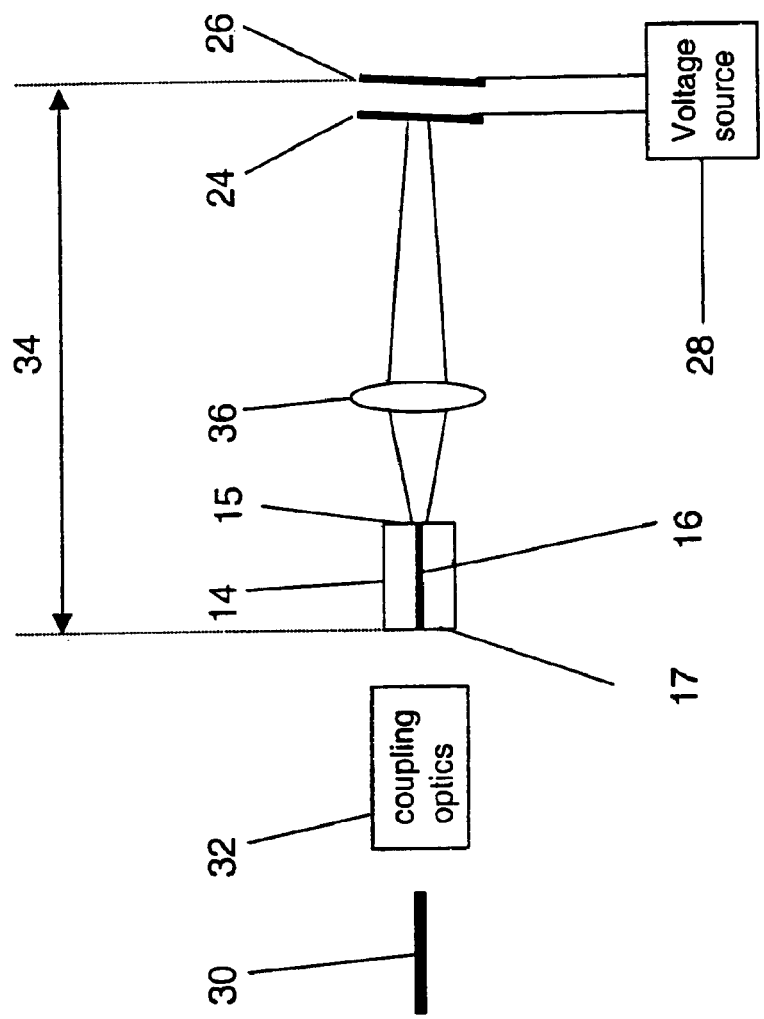
FIG. 5 is a schematic block diagram of an embodiment of the present invention where the laser output is taken from the gain medium.

FIG. 5 shows an embodiment of the present invention wherein a single lens 36 is used to collect light emitted from waveguide endface 15 and focus it onto mirror 24 of the reflective etalon. Methods for selecting and positioning lens 36 to perform this function are known in the art. In addition, light that is emitted from endface 17 is coupled to a single mode optical fiber 30 by coupling optics 32. Coupling optics 32 typically includes one or more lenses to mode match the light emitted from endface 17 to the optical fiber 30, as well as an optical isolator to protect the laser from back reflections. Various designs for coupling optics 32 are known in the art. Note that as shown in FIG. 5, coupling optics 32 and optical fiber 30 need not be inside the laser cavity 34.

Figure 6:
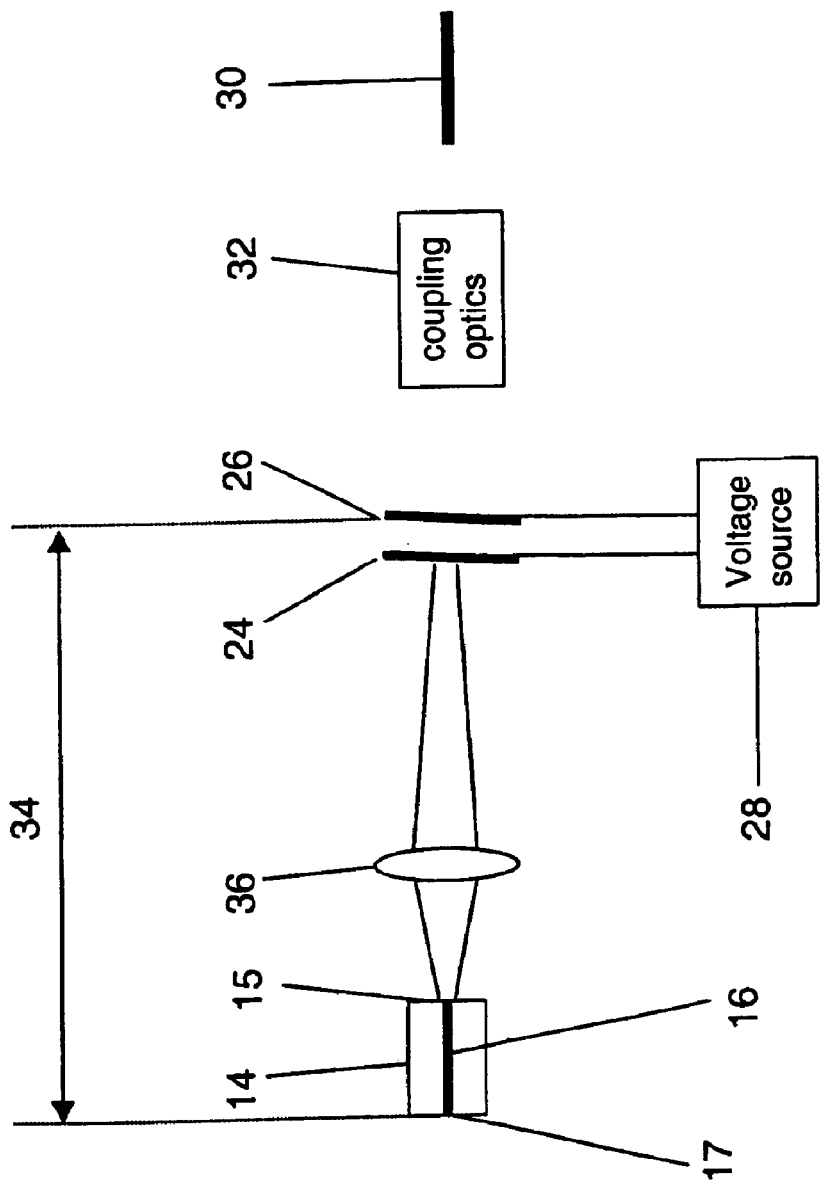
FIG. 6 is a schematic block diagram of an embodiment of the present invention where the laser output is taken from the etalon.

FIG. 6 shows another embodiment of the present invention where the laser output is obtained by transmission through the reflective etalon formed by mirrors 24 and 26. In this case, it is necessary for mirror 26 to be partially transmitting.

Figure 7:
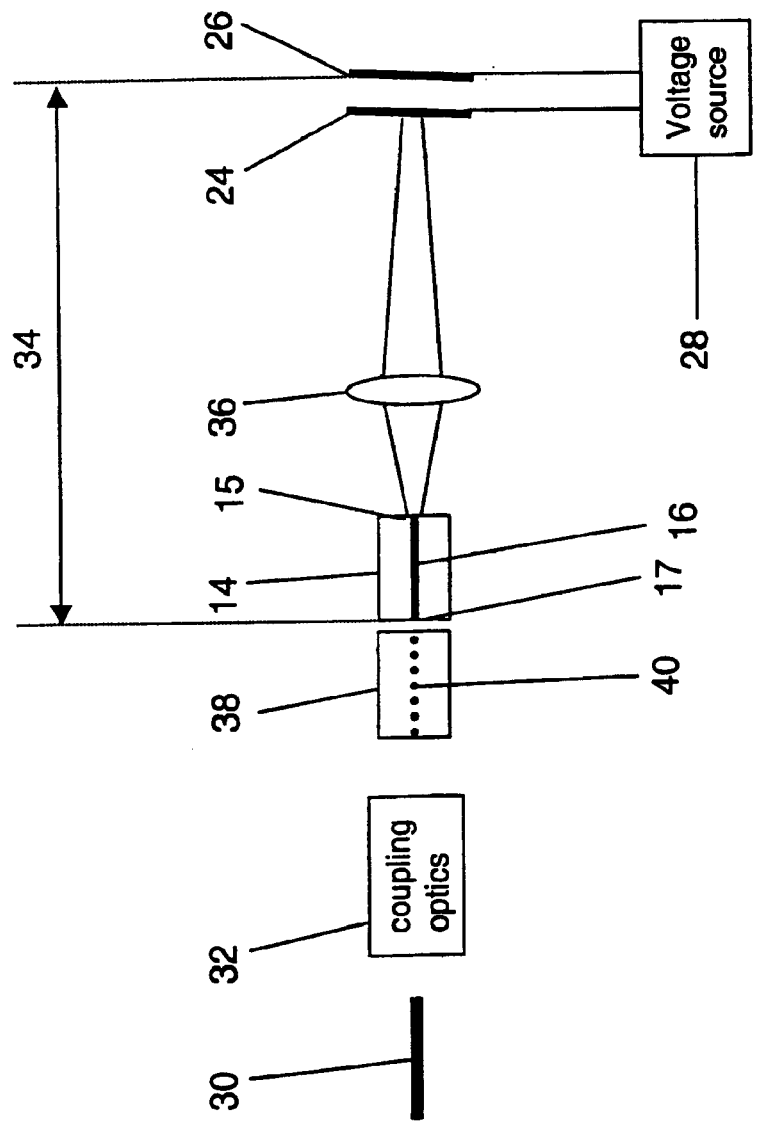
FIG. 7 is a schematic block diagram of an embodiment of the present invention where an optical modulator is butt coupled to the gain medium.

FIG. 7 shows another embodiment of the present invention where an optical modulator 38 is placed between output endface 17 and coupling optics 32. Optical modulator 38 is a waveguide device including a waveguide 40. Optical modulator 38 is preferably placed sufficiently close to gain element 14 that light emitted from waveguide endface 17 is efficiently coupled into waveguide 40 without requiring coupling optics to be placed between gain element 14 and optical modulator 38. Such contiguous positioning is referred in the art to as butt coupling. Modulated light emitted from modulator 38 is coupled to output fiber 30 by coupling optics 32.

Figure 8:
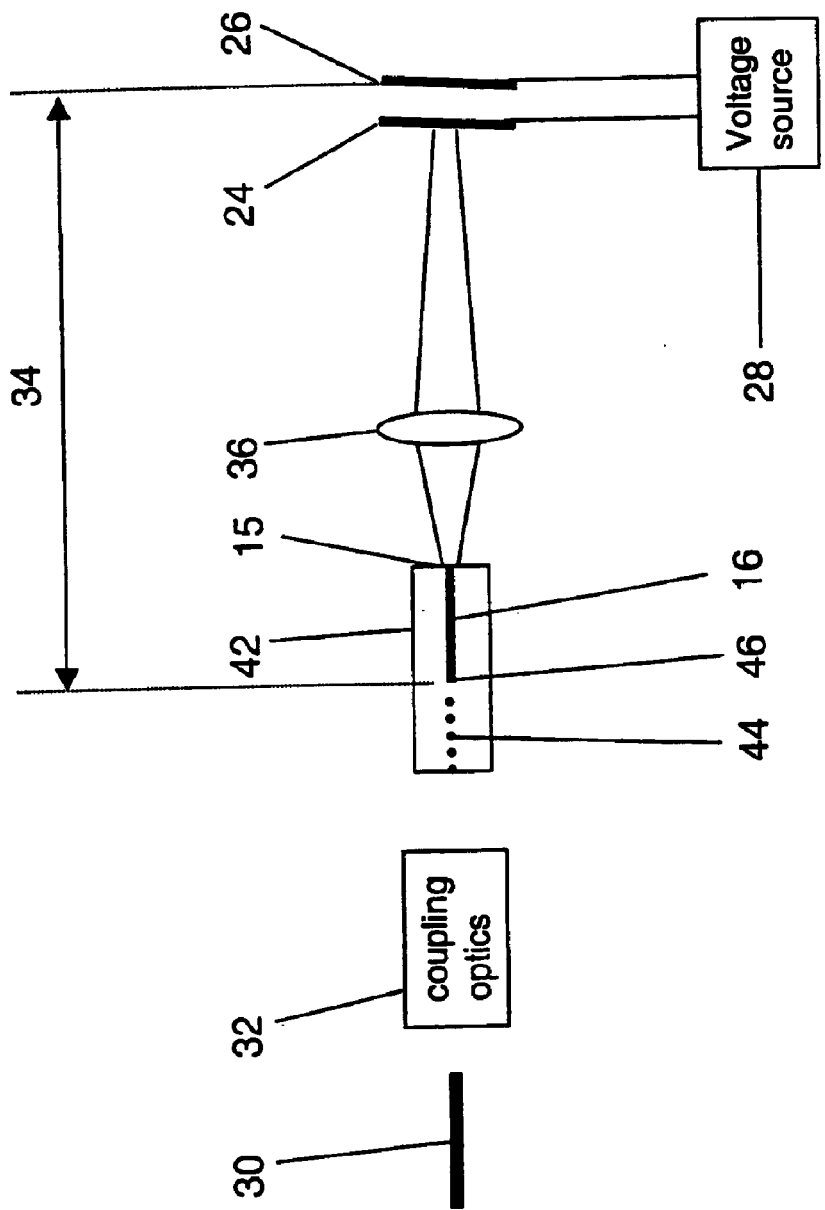
FIG. 8 is a schematic block diagram of an embodiment of the present invention where an optical modulator is monolithically integrated with the gain medium.

FIG. 8 shows another embodiment of the present invention where a gain element and a modulator are monolithically integrated onto one semiconductor chip 42. Waveguide reflector 46 defines the output coupler of laser cavity 34. Light emitted from waveguide reflector 46 enters waveguide 44. Modulated light emitted from chip 42 is coupled to output fiber 30 by coupling optics 32. There are several ways to provide waveguide reflector 46. One approach is to physically etch away material between waveguides 16 and 44, in which case waveguide reflector 46 functions as an endface. A second approach is to insert a Bragg reflector between waveguides 16 and 44, so that the Bragg reflector functions as waveguide reflector 46.

For many tunable laser applications, it is desirable to use control signals to set output power and output wavelength to specific desired values. In the embodiments given above, an output power reference signal can be obtained by monitoring a parasitic beam, such as a beam reflected from grid fixing etalon 20 or a beam transmitted through mirror 26. These parasitic beams can also be used to provide a wavelength reference signal, one known approach being to split a parasitic beam with a beam splitter, pass one portion of the split beam through an optical filter, then compare filtered and unfiltered intensity to derive a wavelength reference signal.

As is evident from the preceding description, the present invention provides a novel laser and laser tuning mechanism, of which a preferred embodiment is a laser tuned by a MEMS reflective etalon. As such, it will be apparent to one skilled in the art that various modifications to the details of construction and method shown here may be made without departing from the scope of the invention, e.g. folding the optical path within the laser cavity and/or tuning element in order to make the laser more compact. It will also be apparent to those skilled in the art that the operating principles that govern the selection of a single oscillation frequency for a tunable laser can also be employed to obtain non-tunable single frequency operation of a laser. Furthermore, etalons need not consist of two separate mirrors. It is known that etalons can be formed by monolithic dielectric and/or semiconductor multilayer structures, and such etalons can be tuned, e.g. by varying the temperature of the etalon.

The previously disclosed embodiments have made use of a semiconductor gain medium in the form of a single mode optical waveguide, since the high gain and spatial filtering provided by such a configuration are preferred. However, the present invention is also applicable to vertical external cavity surface emitting lasers, where the gain medium takes the form of an optically or electrically pumped semiconductor structure adapted for vertical emission of radiation from its top surface (as opposed to a waveguide endface).

Various embodiments have been given which show how the present invention may be combined with an external optical modulator to provide an optical transmitter. It is also possible for the laser of the present invention to be directly modulated by varying the pumping supplied to the gain medium in accordance with a data signal, using well known methods. The embodiment of FIG. 5 is preferred for direct modulation, since high data rate direct modulation requires a short laser cavity, and the laser cavity length can be minimized most effectively in the simple configuration of FIG. 5.

The foregoing detailed description of the invention includes passages that are chiefly or exclusively concerned with particular parts or aspects of the invention. It is to be understood that this is for clarity and convenience, that a particular feature may be relevant in more than just the passage in which it is disclosed, and that the disclosure herein includes all the appropriate combinations of information found in the different passages. Similarly, although the various figures and descriptions herein relate to specific embodiments of the invention, it is to be understood that where a specific feature is disclosed in the context of a particular figure or embodiment, such feature can also be used, to the extent appropriate, in the context of another figure or embodiment, in combination with another feature, or in the invention in general. Further, while the present invention has been particularly described in terms of certain preferred embodiments, the invention is not limited to such preferred embodiments. Rather, the scope of the invention is defined by the appended claims.

What is claimed is:

1. A tunable laser comprising:
   (a) a laser pump;
   (b) a resonant optical cavity having a round trip light path, said optical cavity having an odd number of reflective surfaces and comprising:
   i) a gain medium responsive to pumping by said laser pump, one face of said gain medium forming a first reflective endface of the resonant optical cavity; and ii) a tuning etalon, positioned within the resonant optical cavity, said etalon comprising two spaced apart mirrors having a controllable mirror-to-mirror separation distance, and forming the other reflective endface of said optical cavity, so that light traveling on said round trip light path is reflected from the etalon, and whereby the emission wavelength of the gain medium is determined by a selected separation distance of the etalon mirrors and is selected to have a value that differs from a wavelength of peak reflectivity of the etalon, and wherein said gain medium comprises an electrically pumped, single-mode, semiconductor optical waveguide.

2. The laser of claim 1, wherein said etalon further comprises a microelectromechanical device with an electrically adjustable free spectral range.

3. The laser of claim 2, further comprising a lens positioned between said gain medium and said etalon.

4. The laser of claim 2, further comprising an optical fiber and coupling optics positioned between said gain medium and the optical fiber.

5. The laser of claim 2, further comprising an optical fiber and coupling optics positioned between said etalon and the optical fiber.

6. The laser of claim 2, further comprising means for generating a wavelength reference signal.

7. The laser of claim 2, further comprising means for generating an output power reference signal.

8. The laser of claim 2, wherein said pump has an output power that is variable in response to receipt of a data signal to provide a modulated pump output signal.

9. The laser of claim 2, further comprising an optical fiber and an optical modulator positioned between said resonator and the optical fiber.

10. The laser of claim 9, wherein said optical modulator is contiguous with said semiconductor substrate.

11. The laser of claim 9, wherein said optical modulator is butt-coupled to said gain medium.

* * * * *